United States Patent [19]

Aron

[11] 4,164,145
[45] Aug. 14, 1979

[54] SELF-POWERED ELECTRICAL METER FOR DISPLAY OF A LIQUID-LEVEL OR THE LIKE MEASUREMENT

[75] Inventor: Milton Aron, Newington, Conn.

[73] Assignee: De Laval Turbine Inc., Princeton, N.J.

[21] Appl. No.: 888,467

[22] Filed: Mar. 20, 1978

[51] Int. Cl.² ........................ G01F 23/00; F21V 5/08
[52] U.S. Cl. ...................................... 73/293; 73/313; 136/89 AC; 362/27
[58] Field of Search ......... 73/293, 313, 431, DIG. 11; 362/26, 27, 32; 136/89 AC

[56] References Cited

U.S. PATENT DOCUMENTS

| 2,214,595 | 9/1940 | Rights | 362/27 |
| 2,919,353 | 12/1959 | Paradise | 136/89 AC X |
| 3,433,940 | 3/1969 | Baez et al. | 362/27 |
| 3,678,750 | 7/1972 | De Noia et al. | 73/313 |
| 4,017,725 | 4/1977 | Roen | 136/89 AC X |

OTHER PUBLICATIONS

Amperex; *Uses of Solar Energy;* No. Amer. Phillips Co.

*Primary Examiner*—Charles Gorenstein
*Attorney, Agent, or Firm*—Hopgood, Calimafde, Kalil, Blaustein & Lieberman

[57] ABSTRACT

The invention contemplates a sealed electrical-meter construction for measuring an electrical quantity such as an electrical resistance, and having particular application to the display of liquid-level where measured resistance is a function of observed liquid level. The meter construction provides a transparent side port at which a solar-cell assembly is exposed to external light, and the voltage output of the cell, after reduction to assure constant-voltage level is used to power the measuring circuit. Fiber-optics elements at the transparent side port convey light to the display face of the meter, so that even a flashlight at nighttime is sufficient to excite the solar-cell assembly and illuminate the display face.

15 Claims, 5 Drawing Figures

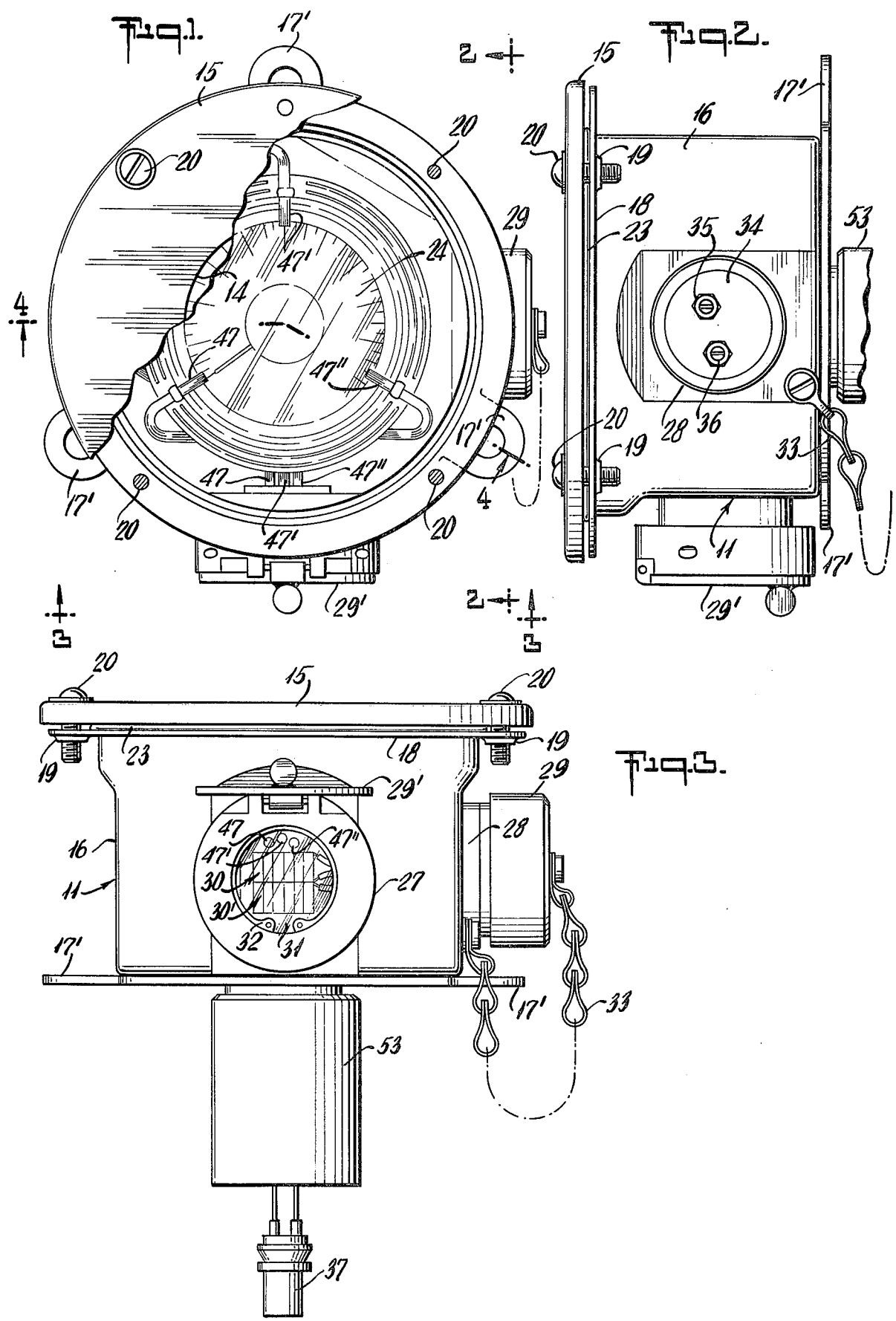

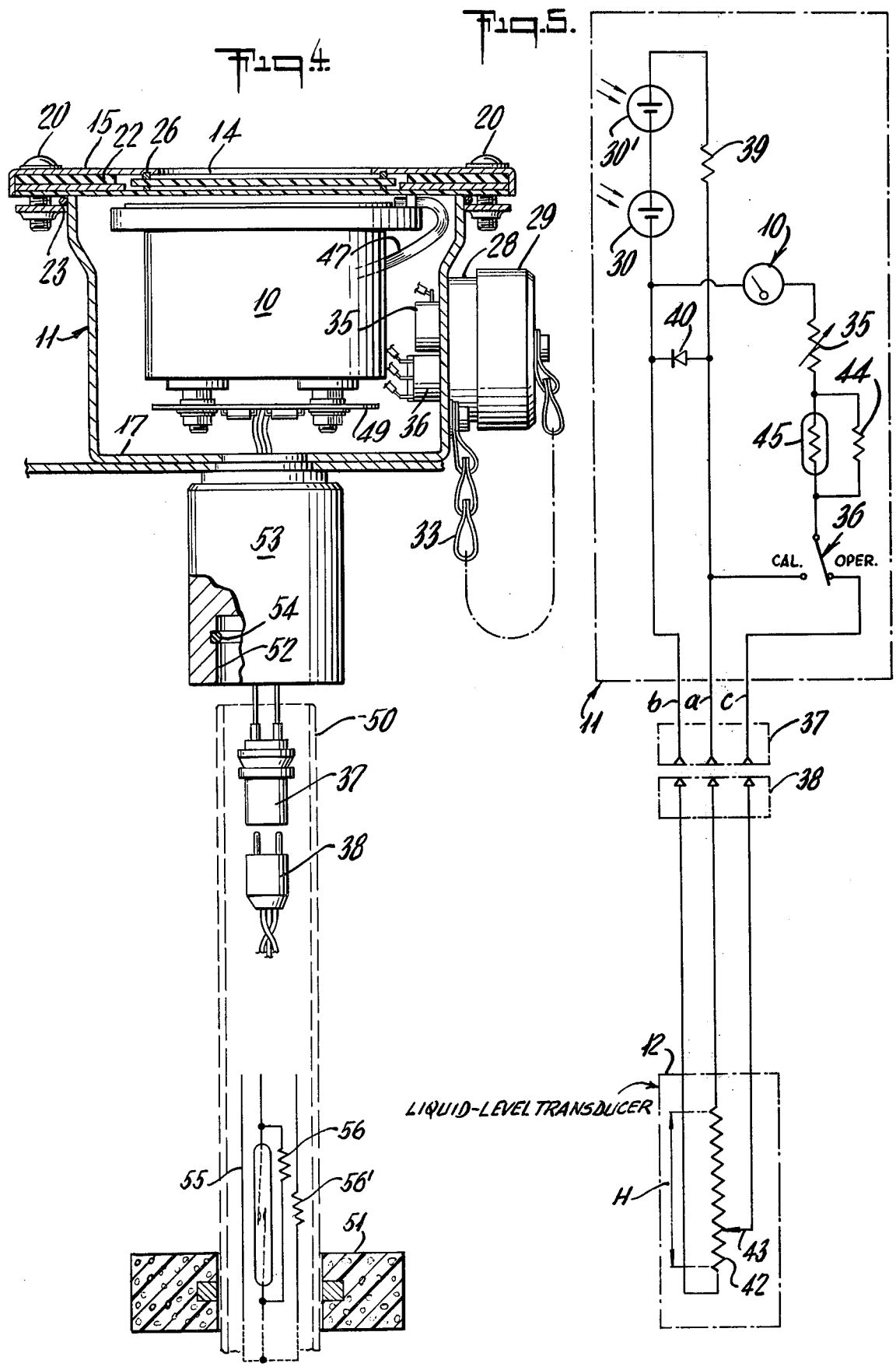

SELF-POWERED ELECTRICAL METER FOR DISPLAY OF A LIQUID-LEVEL OR THE LIKE MEASUREMENT

This invention relates to a self-powered electrical-meter construction, of rugged and weatherproof nature, for measuring an electrical quantity such as resistance under abusive conditions, as of the nature encountered on the unprotected deck of a navigable vessel such as a tanker for freightage of flammable liquid fuel.

In the ignitable and explosive environment of tanker vessels, it is customary to use a remote source to power the liquid-level measuring equipment associated with one or more storage bunkers or tanks, and rigid safety regulations apply to construction and installation of the wiring and junction boxes involved. In particular, intrinsic safety must be assured, and this requirement has established a need for explosion-proof housings and/or Zener-barrier type protection. High cost, complexity, and limited flexibility have been inherent in prior approaches to intrinsic safety.

It is an object of the present invention to provide an improved intrinsically safe electrical metering system of the character indicated, avoiding the high cost and complexity of prior systems.

Another object is to meet the above object with an electrical meter system which provides a reading, without requiring or utilizing either remote power or batteries.

A specific object is to meet the above objects with a construction which is fully self-powered and self-contained, as permanently encapsulated unit, relying upon light incident upon a solar cell within the encapsulation to develop requisite power.

Another specific object is to meet these objects with such sensitive circuitry as to enable precise measurements to be read even though taken at night, using a flashlight as the only source of illumination for the solar cell.

A further specific object is to provide display illumination in such a meter system.

A general object is to meet the foregoing objects with a meter system of such inherent intrinsic safety as to eliminate the need for explosion-proof housings or for Zener-barrier type protection.

Other objects and various further features of novelty and invention will be pointed out or will occur to those skilled in the art from a reading of the following specification, in conjunction with the accompanying drawings. In said drawings, which show, for illustrative purposes only, a preferred form of the invention:

FIG. 1 is a plan view of an electrical meter construction of the invention, a portion of the cover being broken-away to reveal contents;

FIGS. 2 and 3 are elevational views of the meter construction of FIG. 1, taken from aspects designated 2—2 and 3—3 in FIG. 1;

FIG. 4 is a sectional view taken at the bent alignment designated 4—4 in FIG. 1; and FIG. 5 is a simplified electrical diagram showing circuitry associated with the meter of FIG. 1.

Referring to the drawings, the invention is shown in application to an electrical meter, such as an ammeter 10, contained within a rugged housing 11, and connected to a liquid-level transducer 12 (FIG. 5). The display face 13 of the meter is viewable through a window opening 14 in a cover 15 for the housing 11. The housing 11 may be a standard junction-box housing having peripherally continuous sidewall structure 16 extending between a closed base or mounting end 17 and an open upper end, which is closed by the cover 15. As shown, an outward flange 18 at the open end of housing 11 has threaded boss formations 19 at angularly spaced locations to receive anchoring bolts 20 for securing cover 15 over transparent lens or plate means 21 via a gasket 22 and O-ring seal 23; as also shown, a second transparent plate 24 is spaced by an O-ring 25 from the central viewing area of plate 21 and is clamped in place via an O-ring 26 beneath the beaded edge of the opening 14 in cover 15.

As shown, the sidewall housing 11 has two angularly spaced circular port formations 27–28. Port 27 has a flat outer surface which is selectively available for inspection or exposure, upon lifting a hinged protective cover member 29, shown in closed position in FIGS. 1 and 2, and in raised position in FIG. 3; when member 29 is raised, the exposure faces of two solar cell assemblies 30–30' are visible through a transparent plate 31 which closes port 27, snap-ring means 32 being initially used to positionally retain plate 31. Port fitting 28 is externally threaded to removably accept a threaded closure cap 29 having a loose retaining chain connection 33 to the housing 11; an insulating plug 34 closes port 28 and positionally retains, for external calibrating access, a threaded trim rod forming part of a calibrating potentiometer 35, and a toggle switch 36 for selective use in calibration procedure to be described.

The circuitry within housing 11 appears in the upper half of FIG. 5, with detachable and flexible three-lead connection at fitting 37 to the corresponding transducer coupling 38, the three leads being designated a-b-c. Self-powering voltage is generated by series-connection of the solar-cell assemblies 30–30', constant-voltage output at low level being provided by suitable dropping resistor 39 and diode 40. This constant voltage is continuously applied across leads a-b and thence, via coupling means 37–38, across the full-resistance span of the transducer 12, here symbolized by a single resistor 42, with a movable tap connection 43 to the third lead c; it will be understood that depending upon the transducer-detected liquid level, tap 43 will be positioned to pick off proportionally divided fractions of the constant voltage provided across diode 40. When switch 36 is in the measuring position shown in FIG. 5, this tapped voltage is applied across meter 10 and suitable resistor means, shown to comprise the calibrating variable resistor 35 and a fixed resistor 44, the latter being shunted by a temperature-compensating resistance such as a thermistor 45. The display scale of meter 10 will be understood to be calibrated as appropriate to reveal tank level or content (ullage) for the range of liquid levels for which the span H of transducer resistance 42 is effective.

When switch 36 is in its other position, the meter 10 and its related resistors 35-44-45 are directly connected across the constant-voltage output of diode 40, and also across the full resistance (42) span of transducer 12. This should produce a full-scale indication at the display face of meter 10, and the adjustably variable feature of calibrating resistor 35 assures achievement of such full-scale calibration. By shifting switch 36 back to its operating (measuring) position, one is assured of an accurate liquid-level reading at the display face of meter 10.

Having described the electrical contents of housing 11, the description of mechanical components and features will be continued.

In addition to the solar cells exposed at port 27, the ends of three optical-fiber transmission bundles are seen in FIG. 3 at 47–47'–47''; these bundles are thus poised to receive incident light concurrently with the exposure faces of cells 30–30''. The other ends of the respective optical-fiber bundles are suitably mounted, as by means 48 (FIG. 1), to cast edge-illuminating light at three angularly spaced regions of the display scale of meter 10. Thus, when cells 30–30' are excited by light cast by a night-inspector's flashlamp, the bundles 47–47'–47'' will illuminate the display face of meter 10 for as long as needed, to calibrate and/or to take a liquid-level reading.

In view of the severe environmental demands placed upon the meter 10 in the indicated shipboard use, the entire volume within housing 11 is potted, preferably with a clear silicone rubber. Meter 10 is preferably a sealed instrument having its own sealed transparent plate through which its display is viewable, and this sealed instrument is suspended within the silicone rubber of the potting. As shown in FIG. 4, the transparent plate over the meter face is slightly spaced from the transparent plate 21 which closes housing 11, and the potting intimately fills this space; as also shown, the circuit elements 39–40–44–45 may be mounted to a circuit board 49 which is bolted to the terminals of meter 10, and of course all these components as well as cells 30–30', the optical bundles, and elements 35–36 are intimately potted with and in the mass of silicone rubber.

For a liquid-level measuring application of the variety shown for example in Bachman, U.S. Pat. No. 3,982,087, the tap 43 is shifted in accordance with changing elevation of a permanently magnetized annular float, guided along a vertical tube which contains resistance elements and magnetically sensitive switches to provide the movable-tap function symbolized at 43. Such a tube and float are suggested at 50–51, tube 50 being shown ready for telescoping assembly to the bore 52 of an adapter fitting 53, fixed to and forming part of the housing 11. A plate with angularly spaced radial feet 17' is also fixed to and forms part of housing 11, for an installation-mounting purpose. An O-ring 54 retained in bore 52 assures a sealed assembled interfit at 50–52, and a magnetic-reed switch 55 and its associated resistor 56 will be understood to be part of the float-actuable succession of such switches and resistors as are symbolized by the variably tapped resistor 42 of FIG. 5.

The described electrical meter construction will be seen to achieve all stated objects. Reliable nighttime operability occurs for the circumstance that solar cells 30–30' are selected for their voltage substantially greater than that which is limited by diode 40, for operation of the measuring circuit. Specifically, for cells 30–30' producing a combined voltage output of 1.5 volts, and for diode 40 selection to assure 0.6 volt between lines a-b, the device is conservatively and reliably operated by flashlight illumination at port 27, both for the calibrating and for the level-measuring procedures which have been described.

While the invention has been described in detail for a preferred form, it will be seen that modifications may be made without departure from the scope of the invention.

What is claimed is:

1. A self-contained and self-powered meter having an external-circuit connection and for monitoring the electrical condition of an external circuit connected thereto, comprising a housing having a first window opening at a read-out face and having a second window opening at a location offset from said read-out face, a meter assembly mounted within said housing and having a display face visually exposed at said first window opening, a solar-cell assembly producing an electrical-voltage output in response to incident light and mounted within said housing for light exposure at said second window opening, whereby a light source such as a flashlight may be directed at said second window opening for self-powered operation of said meter as at night-time, measuring-circuit means connecting the voltage output of said cell assembly to said meter assembly and to said external-circuit connection, and light-transmitting optical means within said housing and adapted to convey a portion of light entering said second opening to the region of said first window opening for illumination of said read-out face.

2. The self-contained and self-powered meter of claim 1, in which said assemblies and said measuring-circuit means are permanently potted in plastic within the volume of said housing.

3. The self-contained and self-powered meter of claim 2, in which said plastic is transparent to visible light.

4. The self-contained and self-powered meter of claim 1, in which said housing has a third opening spaced from the first and second openings, said measuring-circuit means including a calibrating element with means externally accessible at the third opening for calibrating adjustment of said meter assembly.

5. The self-contained and self-powered meter of claim 4, in which said measuring-circuit means includes a manually operable switch mounted at the third opening for external operating access, said switch in one position operatively connecting said calibrating element and said external-circuit connection with said meter assembly and in another position operatively connecting said calibrating element with said meter assembly to the exclusion of said external-circuit connection.

6. The self-contained and self-powered meter of claim 5, in which said housing includes a removable cover for the third opening.

7. The self-contained and self-powered meter of claim 3, in which a transparent plate closes the first window, and in which said meter assembly includes a transparent plate extending over said display face, said transparent plates being in spaced substantially parallel relation with potting plastic filling the space therebetween.

8. A self-contained and self-powered meter having an external-circuit connection and for monitoring the electrical condition of an external circuit connected thereto, comprising a housing having a first window opening at a read-out face and having a second window opening at a location offset from said read-out face, a meter assembly mounted within said housing and having a display face visually exposed at said first window opening, a solar-cell assembly producing an electrical-voltage output in response to incident light and mounted within said housing for light exposure at said second window opening, measuring-circuit means connecting the voltage output of said cell assembly to said meter assembly and to said external-circuit connection, whereby when connected to an external circuit and in the presence of light at said second window opening the electrical condition of the connected external circuit may be observed at said first window opening, and an optical fiber element positioned within said housing with a light pick-up end at the second window opening and with its other end oriented for illumination of at least part of the display face of said meter assembly.

9. The self-contained and self-powered meter of claim 8, in which said optical fiber element is one of a plurality having their light pick-up ends at the second window opening and with their other ends positioned at spaced locations oriented for illumination of spaced parts of the display face of said meter assembly.

10. A self-contained and self-powered meter having an external-circuit connection and for monitoring the electrical-resistance condition of an external circuit connected thereto, comprising a housing with sidewall structure extending between a base end and an open end, means including a transparent housing plate closing the open end of said housing, an ammeter assembly within said housing and having a display face covered by a transparent face plate and positioned for viewing via both said transparent plates, said sidewall structure including a solar-cell port with a transparent-plate closure, a solar-cell assembly producing an electrical-voltage output in response to incident light and mounted within said housing for light exposure via said port, optical-fiber means within said housing and mounted at one end for light exposure via said port and at its other end for illumination of said display face, measuring-circuit means within said housing and connecting the voltage output of said cell assembly to said meter assembly and to said external-circuit connection, and a potting of transparent plastic material supporting said assemblies and circuit means and otherwise intimately filling the interior of said housing.

11. The self-contained and self-powered meter of claim 10, in which said base end includes a rigid adapter having a tubular portion for sealed telescopic fit with the upper end of the stem of a liquid-level measuring system wherein liquid level is a function of electrical resistance between leads within the stem, said external-circuit connection including means detachably connectable to the stem leads of the liquid-level measuring system.

12. The self-contained and self-powered meter of claim 11, in which said measuring-circuit means includes constant-voltage control means including a dropping resistor and diode providing a constant low-voltage source in the presence of solar-cell output which is nominally substantially in excess of said constant low voltage.

13. The self-contained and self-powered meter of claim 12, in which said measuring-circuit means includes thermally compensated resistance means serially connecting said meter assembly with one of said leads.

14. A self-contained and self-powered liquid-level indicating system, comprising an elongate non-magnetic vertical tube adapted for mounting from above and extending into the liquid-retaining volume of a storage tank or the like, said system including a magnetized annular float surrounding said tube and adapted for buoyant vertical positioning, a sealed magnetic-reed switch within said tube and responsive to float position for actuation in the presence of said float at a predetermined liquid level, tube-circuit means within said tube and including said switch and electrical-resistance means, said circuit means including leads at the upper end of said tube and characterized by a resistance change as viewed at said leads in the circumstance of float actuation of said switch, and a sealed meter having sealed connection to the upper end of said tube and electrically connected to said leads for monitoring the electrical-resistance condition of said tube-circuit means; said sealed meter comprising a housing with sidewall structure extending between an open end and a base end having the sealed connection to said tube, means including a transparent housing plate closing the open end of said housing, an ammeter assembly within said housing and having a display face positioned for viewing via said transparent housing plate, said sidewall structure including a solar-cell port with a transparent closure, a solar-cell assembly producing an electrical-voltage output in response to incident light and mounted within said housing for light exposure via said port, optical-fiber means within said housing and mounted at one end for light exposure via said port and at its other end for illumination of said display face, and measuring-circuit means within said housing and connecting the voltage output of said cell assembly to said meter assembly and to said leads.

15. In a liquid-level measuring system wherein an elongate non-magnetic vertical tube is adapted for mounting from above and extending into the liquid-retaining volume of a storage tank or the like, said system including a magnetized annular float surrounding said tube and adapted for buoyant vertical positioning, and said tube containing circuitry including magnetic-reed switch means and electrical-resistance means responsive to float position for actuation in the presence of said float at a predetermined liquid level, said circuit means including leads at the upper end of said tube and characterized by a resistance change as viewed at said leads in the circumstance of float actuation of said switch, and a sealed meter having sealed connection to the upper end of said tube and electrically connected to said leads for monitoring the electrical-resistance condition of said tube-circuit means; the improvement wherein said sealed meter comprises a housing with sidewall structure extending between an open end and a base end having the sealed connection to said tube, means including a transparent housing plate closing the open end of said housing, an ammeter assembly within said housing and having a display face positioned for viewing via said transparent housing plate, said sidewall structure including a solar-cell port with a transparent closure, a solar-cell assembly producing an electrical-voltage output in response to incident light and mounted within said housing for light exposure via said port, optical-fiber means within said housing and mounted at one end for light exposure via said port and at its other end for illumination of said display face, and measuring-circuit means within said housing and connecting the voltage output of said cell assembly to said meter assembly and to said leads.

* * * * *